United States Patent
Lee et al.

(10) Patent No.: US 9,601,553 B2
(45) Date of Patent: Mar. 21, 2017

(54) ORGANIC LIGHT-EMITTING DISPLAY AND METHOD OF MANUFACTURING THE SAME

(75) Inventors: June-Woo Lee, Yongin (KR); Jong-Moo Huh, Yongin (KR); Joon-Hoo Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 1193 days.

(21) Appl. No.: 13/244,120

(22) Filed: Sep. 23, 2011

(65) Prior Publication Data
US 2012/0267670 A1     Oct. 25, 2012

(30) Foreign Application Priority Data
Apr. 22, 2011   (KR) .................. 10-2011-0037985

(51) Int. Cl.
*H01L 27/32*   (2006.01)
*H01L 33/46*   (2010.01)
*H01L 51/52*   (2006.01)

(52) U.S. Cl.
CPC ........ *H01L 27/3265* (2013.01); *H01L 33/465* (2013.01); *H01L 51/5215* (2013.01); *H01L 51/5218* (2013.01)

(58) Field of Classification Search
CPC ............. H01L 27/3265; H01L 51/5215; H01L 33/465; H01L 51/5218
See application file for complete search history.

(56) References Cited

U.S. PATENT DOCUMENTS

| | | | |
|---|---|---|---|
| 2005/0088081 A1* | 4/2005 | Nishikawa et al. | 313/504 |
| 2007/0252145 A1* | 11/2007 | Toyota et al. | 257/59 |
| 2007/0278480 A1* | 12/2007 | Hwang et al. | 257/40 |
| 2009/0141203 A1* | 6/2009 | Son et al. | 349/39 |
| 2009/0284449 A1 | 11/2009 | Lee et al. | |
| 2010/0182224 A1* | 7/2010 | Iida | G09G 3/3233 345/80 |
| 2011/0140107 A1 | 6/2011 | Kang et al. | |

FOREIGN PATENT DOCUMENTS

| KR | 10-2009-0057689 | 6/2009 |
|---|---|---|
| KR | 10-2009-0120093 | 11/2009 |
| KR | 10-2011-0065820 | 6/2011 |

* cited by examiner

*Primary Examiner* — Tucker J Wright
*Assistant Examiner* — Mark Hatzilambrou
(74) *Attorney, Agent, or Firm* — Lewis Roca Rothgerber Christie LLP

(57) ABSTRACT

An organic light-emitting display having an improved aperture ratio, the organic light-emitting display including a rear electrode, an opposite electrode, and a pixel electrode between the rear electrode and the opposite electrode. Here, an insulating layer is interposed between the pixel electrode and the rear electrode, wherein the pixel electrode, the insulating layer, and the rear electrode are configured as a capacitor of the organic light-emitting display. In such a structure, as the capacitor is disposed in a light-emitting area where the pixel electrode exists, it is not necessary to provide an additional space for a capacitor, thus improving an aperture ratio of the display.

9 Claims, 3 Drawing Sheets

ORGANIC LIGHT-EMITTING DISPLAY AND METHOD OF MANUFACTURING THE SAME

CROSS-REFERENCE TO RELATED APPLICATION

This application claims priority to and the benefit of Korean Patent Application No. 10-2011-0037985, filed on Apr. 22, 2011, in the Korean Intellectual Property Office, the entire content of which is incorporated herein by reference.

BACKGROUND

1. Field

The following description relates to an organic light-emitting display, and more particularly, to an organic light-emitting display having an improved aperture ratio and a method of manufacturing the organic light-emitting display.

2. Description of Related Art

An active matrix organic light-emitting display which has recently attracted a lot of attention includes a thin-film transistor (TFT), a capacitor, and an organic light-emitting diode (OLED) connected to the TFT and the capacitor, in each pixel. The OLED emits light and forms a desired image by receiving an appropriate driving signal from the TFT and the capacitor.

In addition, the capacitor needs to have a sufficient capacity so that the organic light-emitting display more stably displays an image. In other words, a sufficient charging capacity of the capacitor may ensure more natural images. However, an enlargement of the capacitor so as to increase the charging capacity thereof may cause a decrease in a light-emitting area of the OLED, that is, a decrease in an aperture ratio, thereby leading to a decrease in the brightness of the OLED. Accordingly, proper measures need to be taken to prevent or counter this problem.

SUMMARY

Aspects of embodiments of the present invention are directed toward an organic light-emitting display capable of preventing a reduction in an aperture ratio due to the enlargement of a capacitor, and a method of manufacturing the organic light-emitting display.

According to an embodiment of the present invention, there is provided an organic light-emitting display including a pixel electrode; an opposite electrode facing a first side of the pixel electrode; an organic light emission layer interposed between the first side of the pixel electrode and the opposite electrode; a rear electrode facing a second side of the pixel electrode, the second side facing oppositely away from the first side; and an insulating layer interposed between the pixel electrode and the rear electrode, wherein the pixel electrode, the insulating layer, and the rear electrode are configured as a capacitor of the organic light-emitting display.

The pixel electrode and the rear electrode may each be a translucent electrode.

The translucent electrode may have a structure of interposing a silver alloy layer between indium tin oxide (ITO) layers.

The organic light-emitting display may further include a source/drain electrode connected to the pixel electrode, an active layer connected to the source/drain electrode, and the gate electrode disposed to face the active layer.

The gate electrode may include a translucent electrode layer formed on the same layer as the rear electrode and a low-resistance electrode layer formed on the translucent electrode layer.

The organic light-emitting display may further include a capacitor wiring connected to the rear electrode, wherein the capacitor wiring may include a first wiring layer formed on the same layer as the low-electrode layer and connected to the rear electrode, and a second wiring layer formed on the same layer as the source/drain electrode and connected to the first wiring layer.

The rear electrode may be a split electrode divided into several portions each forming a separate capacitor.

According to another embodiment of the present invention, there is provided a method of manufacturing an organic light-emitting display, the method including forming an active layer on a substrate; forming a gate electrode on a first insulating layer disposed on the active layer and forming a rear electrode on the same layer as the gate electrode; forming a second insulating layer having a contact hole, on the gate electrode and the rear electrode; forming a source/drain electrode connected to the active layer and a capacitor wiring connected to the rear electrode through the contact hole; forming a pixel electrode, which faces the rear electrode having the second insulating layer therebetween, so that the pixel electrode is connected to the source/drain electrode; forming an organic light emission layer on the pixel electrode; and forming an opposite electrode facing the pixel electrode having the organic light emission layer therebetween.

The pixel electrode and the rear electrode may each be a translucent electrode.

The translucent electrode may have a structure of interposing a silver alloy layer between indium tin oxide (ITO) layers.

The gate electrode may include a translucent electrode layer formed on the same layer as the rear electrode and a low-resistance electrode layer formed on the translucent electrode layer.

The capacitor wiring may include a first wiring layer formed on the same layer as the low-resistance electrode layer and connected to the rear electrode and a second wiring layer formed on the same layer as the source/drain electrode and connected to the first wiring layer.

The rear electrode is formed of split electrodes respectively forming separate capacitors.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Hereinafter, exemplary embodiments of the present invention will be described fully with reference to the accompanying drawings.

Figure 1:
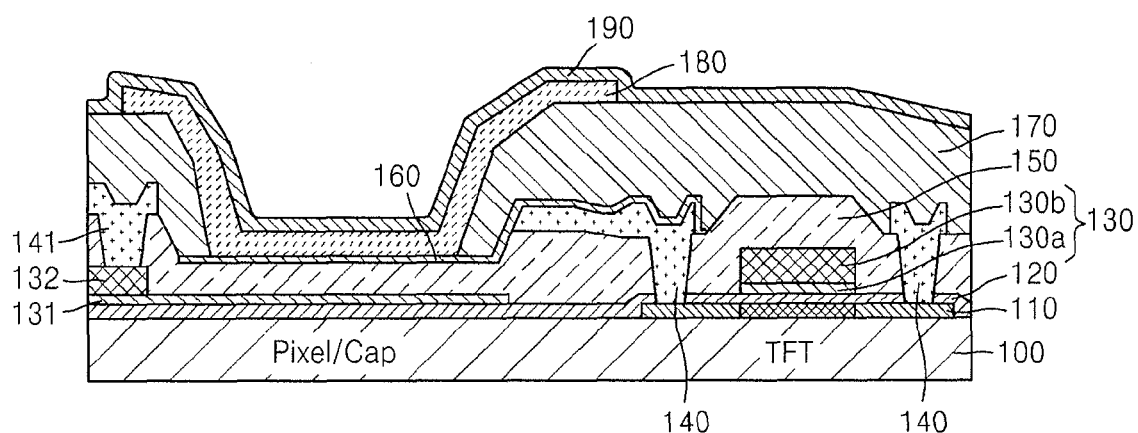
FIG. 1 is a cross-sectional view of an organic light-emitting display according to an embodiment of the present invention.

FIG. 1 is a cross-sectional view of an organic light-emitting display according to an embodiment of the present invention, which is a bottom emission type organic light-emitting display. Although FIG. 1 illustrates a pixel of the organic light-emitting display, the organic light-emitting display includes a plurality of the pixels.

Referring to FIG. 1, the organic light-emitting display according to the current embodiment includes a thin-film transistor unit TFT and a pixel/capacitor unit Pixel/Cap which are formed on a substrate 100 and are electrically connected with each other. The thin-film transistor unit TFT is connected to a pixel electrode 160 of the pixel/capacitor unit Pixel/Cap to supply an appropriate current for light emission. The pixel/capacitor unit Pixel/Cap illuminates an organic light emission layer 180 based on the current supplied from the thin-film transistor unit TFT to form an image and also performs charging (e.g., performs charge storing and discharging) as a capacitor. That is, in the current embodiment, the pixel electrode 160 of the pixel/capacitor unit Pixel/Cap is used as an electrode for illuminating the organic light emission layer 180 and also used as an electrode for charging as a capacitor. Accordingly, no special capacitors need to be included, which may help to obtain a sufficient aperture ratio. Therefore, high resolution images may be displayed.

Hereinafter, a detailed structure of the organic light-emitting display having such a feature will be described.

The thin-film transistor unit TFT includes an active layer 110 formed on the substrate 100, a gate electrode 130 formed to face the active layer 110 by interposing a first insulating layer 120 between the active layer 110 and the gate electrode 130, and source/drain electrodes 140, one of which is connected to the pixel electrode 160 of the pixel/capacitor unit Pixel/Cap via the active layer 110. Accordingly, when a proper voltage is applied to the gate electrode 130, the active layer 110 may enter into a state where a current can flow, and thus, a current may be supplied to the pixel electrode 160 which is connected to one of the source/drain electrodes 140.

The gate electrode 130 may be formed to have a multi-layered structure in which a low-resistance electrode layer 130b such as molybdenum may be stacked on a translucent electrode layer 130a obtained by interposing a silver alloy layer between indium tin oxide (ITO) layers, for example. The translucent electrode layer 130a is formed of the same material and of the same layer as a rear electrode 131 for a capacitor, which will be explained below. The low-resistance electrode layer 130b is formed of a relatively low-resistance material for smooth transmission of a gate signal.

The pixel/capacitor unit Pixel/Cap includes the rear electrode 131, the pixel electrode 160, an opposite electrode 190, and the organic light emission layer 180. The rear electrode 131 is formed of the same material and of the same layer as the translucent electrode layer 130a of the gate electrode 130, i.e., on the first insulating layer 120. The pixel electrode 160 faces the rear electrode 131 with a second insulating layer 150 therebetween, and is connected to one of the source/drain electrodes 140. The opposite electrode 190 faces the pixel electrode 160, and the organic light emission layer 180 is interposed between the pixel electrode 160 and the opposite electrode 190. Accordingly, when an electric current is supplied to the pixel electrode 160 via the source/drain electrode 140 of the thin-film transistor unit TFT, light is emitted from the organic light emission layer 180, thus forming an image. The pixel electrode 160 and the rear electrode 131 also function as a capacitor. The pixel electrode 160 and the rear electrode 131 form a structure of a capacitor by facing each other with the second insulating layer 150 therebetween. Accordingly, the pixel electrode 160 and the rear electrode 131 may also function as a capacitor in a portion of the generated illumination. Furthermore, in the current embodiment, the pixel electrode 160 may also be formed of a translucent electrode obtained by interposing a silver alloy layer between ITO layers. When the pixel electrode 160 and the rear electrode 131 are formed as translucent electrodes, light emitted from the organic light emission layer 180 generates a micro cavity between the pixel electrode 160 and the opposite electrode 190, thus obtaining stronger light. That is, when the light emitted from the organic light emission layer 180 shuttles between the pixel electrode 160 and the rear electrode 131, which are translucent electrodes, constructive or destructive interference occurs, thus strengthening or destroying an intensity of the light. Therefore, stronger light may be obtained by properly adjusting a space between the pixel electrode 160 and the rear electrode 131 so that light results in constructive interference.

Reference numerals 132 and 141 denote capacitor wirings connected to the rear electrode 131. The reference numeral 132 denotes a first wiring layer formed of the same layer as the low-resistance electrode layer 130b of the gate electrode 130. The reference numeral 141 denotes a second wiring layer formed of the same layer as the source/drain electrodes 140. A reference numeral 170 denotes a pixel-defining film.

The organic light-emitting display having the structure described above may be manufactured by following a method illustrated in FIGS. 2A through 2F.

FIGS. 2A through 2F are cross-sectional views illustrating a method of manufacturing the organic light-emitting display of FIG. 1, according to an embodiment of the present invention.

Figure 2A:
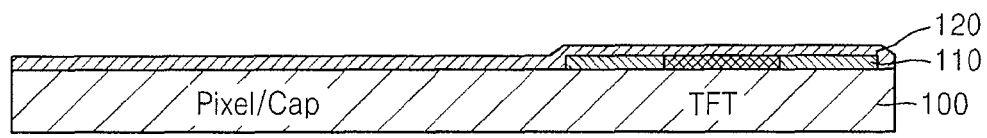
FIGS. 2A through 2F are cross-sectional views illustrating a method of manufacturing the organic light-emitting display of FIG. 1, according to an embodiment of the present invention.

As illustrated in FIG. 2A, the active layer 110 is formed in the thin film transistor unit TFT on the substrate 100, and the first insulating layer 120 is formed on the active layer 110.

Figure 2B:
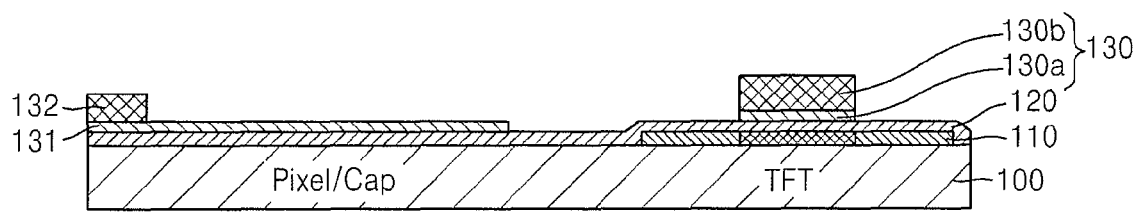

Next, as illustrated in FIG. 2B, a gate electrode 130 is formed on the active layer 110 of the thin-film transistor unit TFT to face the active layer 110. At the same time, the rear electrode 131 and the first wiring layer 132 (as a capacitor wiring) are formed of the same layer as the gate electrode 130, in the pixel/capacitor unit Pixel/Cap. That is, the translucent electrode layer 130a of the gate electrode 130 and the rear electrode 131 are formed of the same layer, and the low-resistance electrode 130b of the gate electrode 130 and the first wiring layer 132 (as a capacitor wiring) are formed of the same layer on the translucent electrode layer 130a and the rear electrode 131, respectively.

Figure 2C:
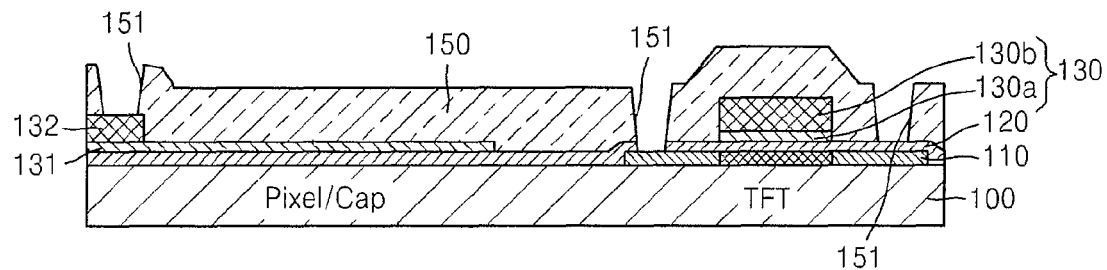

Then, as illustrated in FIG. 2C, the second insulating layer 150 is formed. Contact holes 151 are also formed to expose the active layer 110 and the first wiring layer 132.

Figure 2D:
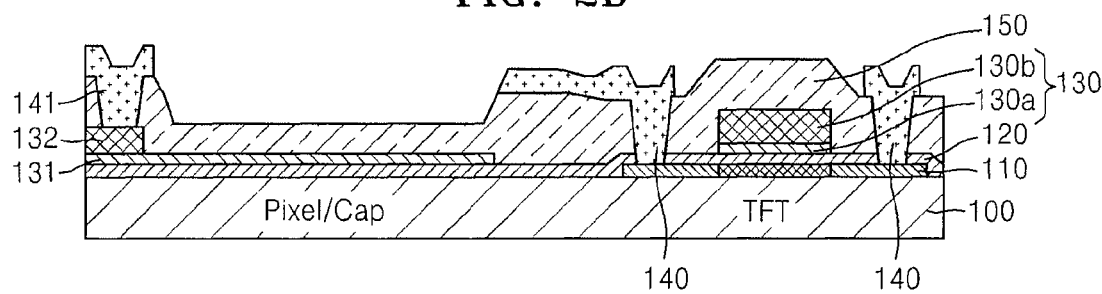

As illustrated in FIG. 2D, the source/drain electrodes 140 and the second wiring layer 141 are formed through the contact holes 151 so as to contact the active layer 110 and the first wiring layer 132, respectively.

Figure 2E:
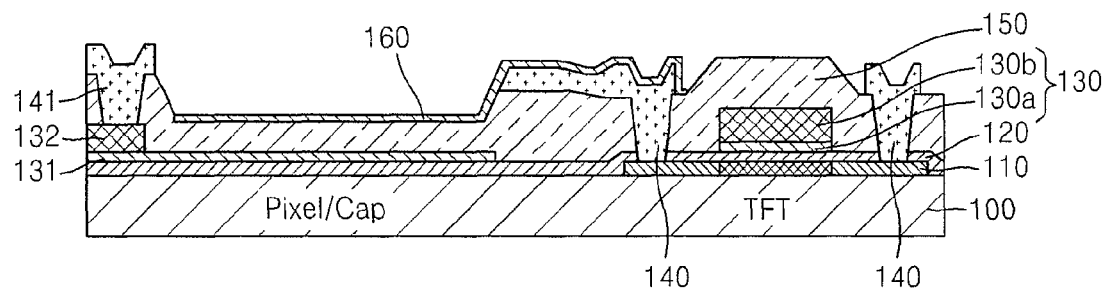

Then, as illustrated in FIG. 2E, the pixel electrode 160 connected to the source drain electrodes 140 is formed to face the rear electrode 131. In this way, a structure of a capacitor including the pixel electrode 160 and the rear electrode 131 as two electrodes of the capacitor is formed.

Figure 2F:
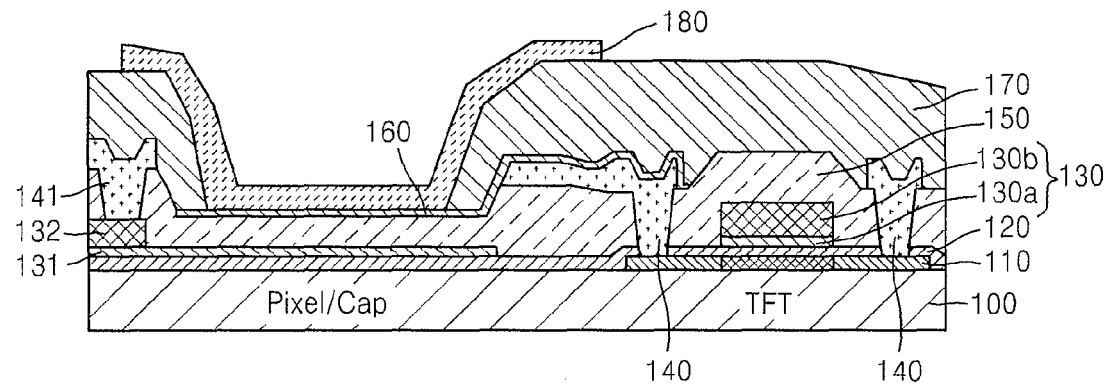

Next, as illustrated in FIG. 2F, the organic light emission layer 180 is formed on the pixel electrode 160 which is defined in units of pixels by the pixel-defining film 170, and the opposite pixel 190 is formed on the organic light emission layer 180 (Refer to FIG. 1). Thus, a basic structure of the organic light-emitting display for performing light emission and charging according to a signal from the thin-film transistor unit TFT is formed. That is, light emission of the organic light emission layer 180 is generated between the pixel electrode 160 and the opposite electrode 190, while a capacitor is charged between the pixel electrode 160 and the rear electrode 190.

As the organic light-emitting display manufactured by such a method has both the capacitor and the pixel electrode 160 in a pixel portion, it is not necessary to provide an additional space for the capacitor, which may help to enhance an aperture ratio. Therefore, the organic light-emitting display may have an advantage in having high resolution. Furthermore, as the pixel electrode 160 and the rear electrode 131 are formed of translucent electrodes, the organic light-emitting display may also provide a structure which is very effective on generating a constructive interference of light by using a micro cavity.

Figure 3:
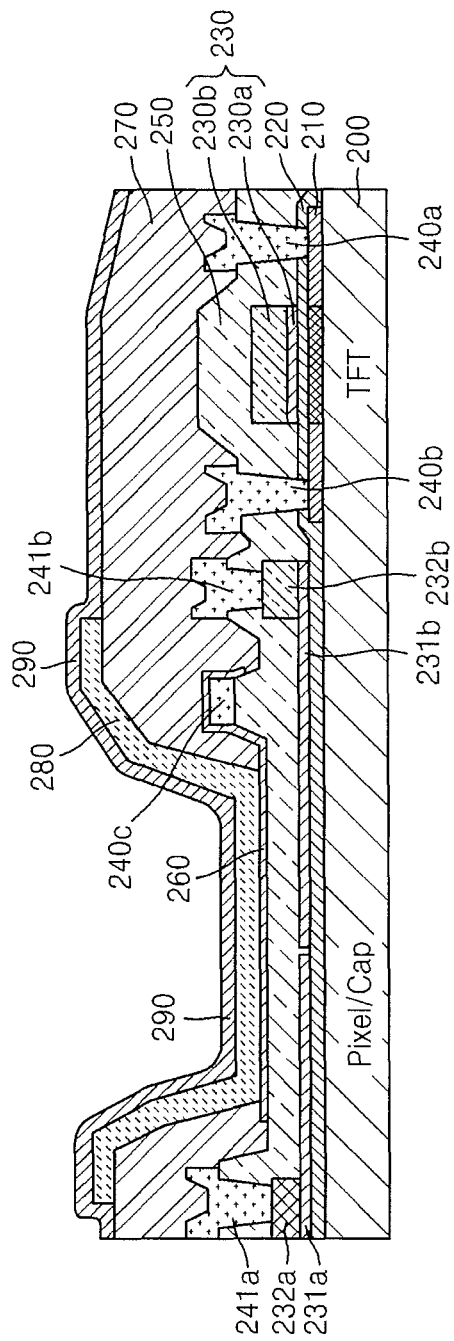
FIG. 3 is a cross-sectional view of an organic light-emitting display according to another embodiment of the present invention.

FIG. 3 is a cross-sectional view of an organic light-emitting display according to another embodiment of the present invention.

The current embodiment illustrates a modification example in which the number of capacitors is increased. Like the previous embodiment, a pixel electrode 260 in the current embodiment is used for both light emission and charging.

Referring to a thin-film transistor unit TFT, an active layer 210, a first insulating layer 220, a gate electrode 230, and source/drain electrodes 240a, 240b, and 240c are formed on a substrate 200. The gate electrode 230 is formed to have a multi-layered structure formed by stacking a low-resistance electrode layer 230b on a translucent electrode layer 230a.

As illustrated in the cross-sectional view of FIG. 3, the source/drain electrode 240b connected to the active layer 210 and the source/drain electrode 240c connected to a pixel electrode 260 may seem to be electrically separate from each other. However, the source/drain electrode 240c and the source/drain electrode 240b are actually connected with each other.

Next, a pixel/capacitor unit Pixel/Cap includes a pair of rear electrodes 231a and 231b, the pixel electrode 260, an opposite electrode 290, and an organic light emission layer 280. The rear electrodes 231a and 231b are formed on a first insulating layer 220, of the same material and of the same layer as a translucent electrode layer 230a of the gate electrode 230. The pixel electrode 260 faces the rear electrodes 231a and 231b with a second insulating layer 250 therebetween and is connected to the source/drain electrode 240c. The opposite electrode 290 faces the pixel electrode 260, and the organic light emission layer 280 is interposed between the pixel electrode 260 and the opposite electrode 290.

Accordingly, when an electric current is supplied to the pixel electrode 260 via the source/drain electrodes 240a, 240b, and 240c of the thin-film transistor unit TFT, light emission is generated from the organic light emission layer 280, thus forming an image. The pixel electrode 260 and the rear electrodes 231a and 231b also function as a capacitor. That is, the pixel electrode 260 and the rear electrodes 231a and 231b face each other with a second insulating layer 250 therebetween, thereby forming a structure of one or more capacitors. As such, a function of a capacitor may be implemented in the light emission area.

Furthermore, in the current embodiment, the pixel electrode 260 and the rear electrodes 231a and 231b are formed of translucent electrodes obtained by interposing a silver alloy layer between indium tin oxide (ITO) layers. Therefore, light emitted from the organic light emission layer 280 may generate a micro cavity between the pixel electrode 260 and the opposite electrode 290, thus obtaining stronger light.

Reference numerals 232a, 232b, 241a, and 241b denote capacitor wirings connected to the rear electrode 231. The reference numerals 232a and 232b denote first wiring layers 232a and 232b formed of the same layer as the low-resistance electrode layer 230b of the gate electrode 230. The reference numerals 241a and 241b denote second wiring layers 241a and 241b formed of the same layer as the source/drain electrodes 240a, 240b, and 240c. A reference numeral 270 denotes a pixel-defining film.

Accordingly, the organic light-emitting display according to the current embodiment may include two capacitors formed by depositing a pair of the rear electrodes 231a and 231b, and the two capacitors may be deposited in the pixel portion under the pixel electrode 260, thus enhancing an aperture ratio.

In addition, like the previous embodiment, as the pixel electrode 260 and the rear electrodes 231a and 231b are formed of translucent electrodes, an effect of constructive interference of light by using on a micro cavity may be used for obtaining stronger light.

The organic light-emitting displays according to the above-described embodiments of the present invention may provide a sufficient aperture ratio without having to reduce a capacitor, thus forming a stable high resolution image.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. An organic light-emitting display comprising:
a plurality of pixels, each pixel comprising:
a pixel electrode;
an opposite electrode facing a first side of the pixel electrode;
an organic light emission layer between the first side of the pixel electrode and the opposite electrode;
a rear electrode facing a second side of the pixel electrode, the second side facing oppositely away from the first side; and
an insulating layer between the second side of the pixel electrode and the rear electrode,
wherein the pixel electrode, the insulating layer, and the rear electrode are configured as a plurality of capacitors of the organic light-emitting display, and the pixel electrode overlaps with and is located between the organic light emission layer and the rear electrode,
wherein the rear electrode is a split electrode divided into several discontiguous portions each forming a separate capacitor of the plurality of capacitors, and
wherein the several discontiguous portions together extend from a first edge of the pixel electrode to a second edge of the pixel electrode facing away from the first edge, such that a micro cavity extends from the first edge to the second edge.

2. The organic light-emitting display of claim 1, wherein each of the pixel electrode and the rear electrode is a translucent electrode.

3. The organic light-emitting display of claim 2, wherein the translucent electrode has a structure in which a silver alloy layer is interposed between indium tin oxide (ITO) layers.

4. The organic light-emitting display of claim 1, further comprising:
   source/drain electrodes, one of which is connected to the pixel electrode;
   an active layer connected to the source/drain electrodes; and
   a gate electrode facing the active layer.

5. The organic light-emitting display of claim 4, wherein the gate electrode comprises a translucent electrode layer formed of a same layer as the rear electrode and a low-resistance electrode layer formed on the translucent electrode layer.

6. The organic light-emitting display of claim 5, further comprising a capacitor wiring connected to the rear electrode,
   wherein the capacitor wiring comprises a first wiring layer formed of a same layer as the low-resistance electrode layer and connected to the rear electrode and a second wiring layer formed of a same layer as the source/drain electrodes and connected to the first wiring layer.

7. The organic light-emitting display of claim 1, wherein the pixel electrode is configured with the rear electrode and the organic light emission layer to provide a micro cavity to construct an intensity of light emitted from the organic light emission layer.

8. An organic light-emitting display comprising:
   a plurality of pixels, each pixel comprising:
   a rear electrode;
   an opposite electrode;
   a pixel electrode between the rear electrode and the opposite electrode;
   an organic light emission layer between the pixel electrode and the opposite electrode; and
   an insulating layer between the pixel electrode and the rear electrode,
   wherein the pixel electrode, the insulating layer, and the rear electrode are configured as a plurality of capacitors of the organic light-emitting display, and the pixel electrode is configured with the organic light emission layer and the opposite electrode as an organic light emitting diode (OLED) of the organic light-emitting display,
   wherein the rear electrode is a split electrode divided into several discontiguous portions each forming a separate capacitor of the plurality of capacitors, and
   wherein the several discontiguous portions together extend from a first edge of the pixel electrode to a second edge of the pixel electrode facing away from the first edge, such that a micro cavity extends from the first edge to the second edge.

9. The organic light-emitting display of claim 8, wherein the pixel electrode is configured with the rear electrode and the organic light emission layer to provide a micro cavity to construct an intensity of light emitted from the organic light emission layer.

* * * * *